US008519323B2

(12) United States Patent
Nakada et al.

(10) Patent No.: US 8,519,323 B2
(45) Date of Patent: Aug. 27, 2013

(54) ELECTRIC FIELD/MAGNETIC FIELD SENSORS AND METHODS OF FABRICATING THE SAME

(75) Inventors: Masafumi Nakada, Tokyo (JP); Mizuki Iwanami, Tokyo (JP); Keishi Oohashi, Tokyo (JP); Norio Masuda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/412,046

(22) Filed: Mar. 5, 2012

(65) Prior Publication Data

US 2012/0164321 A1 Jun. 28, 2012

Related U.S. Application Data

(62) Division of application No. 11/993,878, filed as application No. PCT/JP2006/313446 on Jun. 29, 2006, now Pat. No. 8,153,955.

(30) Foreign Application Priority Data

Jun. 30, 2005 (JP) ................................ 2005-191806

(51) Int. Cl.
*G01J 1/04* (2006.01)
*H01J 3/14* (2006.01)

(52) U.S. Cl.
USPC ..................................... 250/227.14; 250/216

(58) Field of Classification Search
USPC .................. 250/227.11, 216, 227.14, 227.19, 250/227.27; 340/561, 500, 551, 567; 356/73.1, 356/450, 454, 519; 359/280–284, 324, 484.01–484.1; 385/12
See application file for complete search history.

(56) References Cited

U.S. PATENT DOCUMENTS

| | | | | |
|---|---|---|---|---|
| 4,523,092 | A | 6/1985 | Nelson | |
| 4,533,829 | A * | 8/1985 | Miceli et al. | 250/227.27 |
| 4,778,987 | A | 10/1988 | Saaski et al. | |
| 5,602,387 | A | 2/1997 | Bowen | |
| 5,779,365 | A | 7/1998 | Takaki | |
| 5,850,140 | A | 12/1998 | Tokano et al. | |
| 6,608,952 | B2 * | 8/2003 | Eggleton et al. | 385/43 |
| 6,771,410 | B1 | 8/2004 | Bourlanoff et al. | |
| 2006/0098695 | A1 | 5/2006 | Mitrofanov | |

FOREIGN PATENT DOCUMENTS

| | | |
|---|---|---|
| CN | 1291287 | 4/2001 |
| JP | 59-166873 | 9/1984 |
| JP | 61-62882 | 3/1986 |
| JP | 2-28574 | 1/1990 |
| JP | 6-109640 | 4/1994 |
| JP | 10-62625 | 3/1998 |
| JP | 2004-012468 | 1/2004 |

OTHER PUBLICATIONS

Akedo, "Aerosol Deposition and its Application," J. of Surf. Sci. Soc. of Jap., vol. 25, No. 10, pp. 25-31 (2004).*

(Continued)

*Primary Examiner* — Pascal M Bui Pho
(74) *Attorney, Agent, or Firm* — Young & Thompson

(57) ABSTRACT

A magnetic field sensor fabrication method of directly forming, with an aerosol deposition method, at a tip of an optical fiber, a magnetooptical layer having a refractive index that changes depending on a magnetic field, the method includes establishing a relationship of dc≦d≦dr among a diameter d of the magnetooptical layer, a diameter dc of a core of the optical fiber, and a diameter dr of a clad thereof.

9 Claims, 7 Drawing Sheets

(56) References Cited

OTHER PUBLICATIONS

Chinese Patent Office issued a Chinese Office Action dated Mar. 10, 2010, Application No. 200680024139.3.

Akedo, "Aerosol Deposition and its Application," J. of Surf. Sci. Soc. of Jap., vol. 25, No. 10, pp. 25-31 (Oct. 10, 2004).

CN Office Action dated Aug. 3, 2011, with English Translation.

* cited by examiner

ELECTRIC FIELD/MAGNETIC FIELD SENSORS AND METHODS OF FABRICATING THE SAME

CROSS REFERENCE TO RELATED APPLICATIONS

This application is a division of co-pending application Ser. No. 11/993,878 filed Dec. 26, 2007, which is a National Stage of PCT/JP2006/313446 filed on Jun. 29, 2006, which claims foreign priority to Japanese Application Serial No. 2005-191806 filed on Jun. 30, 2005. The entire content of each of these applications is hereby expressly incorporated by reference.

TECHNICAL FIELD

This invention relates to electric field/magnetic field sensors and methods of fabricating them and, in particular, relates to electric field/magnetic field sensors each having high sensitivity/high spatial resolution for application to a very small region of an LSI chip/package and methods of fabricating them.

BACKGROUND ART

Sensors and detection systems for detecting physical quantities such as an electric field and a magnetic field are disclosed in Patent Document 1 (Japanese Unexamined Patent Application Publication (JP-A) No. Sho 59-166873) and Patent Document 2 (Japanese Unexamined Patent Application Publication (JP-A) No. Hei 2-28574).

FIG. 1 is a sectional view showing the structure of a conventional high-spatial-resolution electric field sensor using an optical technique and FIG. 2 is a diagram showing an example of a detection system using the electric field sensor of FIG. 1.

Referring to FIG. 1, an electric field sensor 905 is bonded to the tip of an optical fiber 901 through an adhesive layer 906. The electric field sensor 905 comprises a fine electrooptical crystal 907 serving as an electric field detection element and a dielectric multilayer reflective layer 908 formed on a bottom surface of the electrooptical crystal 907 for reflecting light.

Referring to FIG. 2, the detection system comprises a continuous laser light source 900, fiber amplifiers 902 and 911, a polarization controller 903, an optical circulator 904, the electric field sensor 905 provided over a circuit board 909 being an object to be measured, an analyzer 910, a photodetector 912, optical fibers 901 connecting them to each other, and a spectrum analyzer 913.

The electric field detection principle of this detection system will be briefly described hereinbelow. Light emitted from the continuous laser light source 900 is amplified by the fiber amplifier 902 and subjected to control of its polarization plane by the polarization controller 903 and then is incident on the electric field sensor 905 through the optical circulator 904. The incident light on the electric field sensor 905 is reflected by the dielectric multilayer reflective layer 908 formed on the bottom surface of the electrooptical crystal 907 and then is again returned into the optical fiber 901. Since the electrooptical crystal 907 changes its refractive index depending on an electric field generated from the circuit board 909, the polarization state of the laser light propagating in the crystal changes while being subjected to modulation according to the intensity of the external electric field. The modulated light again passes through the optical circulator 904, then is converted into intensity-modulated light by the analyzer 910 and amplified by the fiber amplifier 911, and then is converted into an electrical signal by the photodetector 912.

The electrical signal is detected by the spectrum analyzer 913 and a peak that occurs at that time is determined to be a signal caused by the external electric field. On the principle of this detection system, the signal intensity differs depending on the intensity of the external electric field and, therefore, the electric field distribution is obtained by changing the position of the electric field sensor 905 over the circuit board 909.

Incidentally, by replacing the electrooptical crystal 907 in FIG. 1 with a magnetooptical crystal, the system of FIG. 2 becomes a magnetic field detection system having high spatial resolution. The magnetic field detection principle in this case can be explained by replacing "electric field" with "magnetic field" in the foregoing explanation of the electric field detection principle.

As described above, the conventional electric field detection system or magnetic field detection system having high spatial resolution is characterized by having the structure in which the microfabricated electrooptical crystal or magnetooptical crystal is bonded to the tip of the optical fiber 901.

An application region and spatial resolution of an electric field detection system or a magnetic field detection system are limited by the size of an electrooptical crystal or a magnetooptical crystal and, as the size decreases, the system can be applied to a smaller region and has a higher spatial resolution. The spatial resolution is determined based on the volume of sensor light propagating in the crystal and, as the volume of the sensor light decreases, the spatial resolution increases. For example, to describe a conventional magnetic field sensor in which a magnetooptical crystal is bonded to the tip of an optical fiber, the magnetic field sensor having a 10 μm-class spatial resolution is realized using the crystal having a plane size of 270 μm×270 μm and a thickness of 11 μm.

However, with such a structure, it is difficult to realize a further reduction in size and a further increase in spatial resolution of a sensor due to the limitation of the crystal microfabrication technique and, thus, it is not possible to provide a sensor applicable to a very small region of an LSI chip/package.

Further, in the case of the conventional type sensor, since the crystal is bonded to the tip of the optical fiber as described above, loss of light is caused by the adhesive layer and this loss causes a reduction in sensitivity of the sensor and thus makes it difficult to detect a very small electric field or magnetic field generated from an LSI chip or the like.

It is an object of this invention to realize a sensor having high sensitivity and high spatial resolution while being smaller in size than the conventional electric field/magnetic field sensor, thereby providing the sensor applicable to a very small region of an LSI chip/package.

DISCLOSURE OF THE INVENTION

This invention has been made based on the knowledge that it is effective to directly form an electrooptical layer or a magnetooptical layer in the form of a thin film at the tip of an optical fiber for the purpose of realizing an electric field/magnetic field sensor having high sensitivity and high resolution.

An electric field sensor according to this invention is characterized in that an electrooptical layer is directly formed at the tip of an optical fiber. With this configuration, a reduction in thickness of the electrooptical layer is enabled to thereby realize high resolution. Further, the interference effect can be utilized to thereby achieve an increase in sensitivity.

Further, an electric field sensor according to this invention is characterized in that an electrooptical layer is directly formed at the tip of an optical fiber and a reflective layer is formed on the surface of the electrooptical layer. An electric field sensor according to this invention enables a further increase in sensitivity by directly laminating, at the tip of an optical fiber, an electrooptical layer and a lower and an upper reflective layer so as to vertically sandwich therebetween the electrooptical layer to thereby form a Fabry-Perot resonator.

It is preferable that a diameter d of the electrooptical layer satisfy a relationship of $dc \leqq d \leqq dr$ with a diameter dc of a core of the optical fiber and a diameter dr of a clad thereof.

Further, by setting a thickness t of the electrooptical layer to $t \geqq 1$ μm, it is possible to increase the Q value of the Fabry-Perot resonator and thus to achieve an increase in sensitivity. The electrooptical layer is preferably formed by a film forming method, particularly an aerosol deposition method. According to the aerosol deposition method, it is possible to form an electrooptical film having a thickness of 1 μm or more and thus to enhance the sensitivity.

The composition of the electrooptical layer is one of lead zirconate titanate, lanthanum-added lead zirconate titanate, barium titanate, strontium-added barium titanate, and tantalum-added potassium niobate.

A magnetic field sensor according to this invention is characterized in that a magnetooptical layer is directly formed at the tip of an optical fiber. With this configuration, a reduction in thickness of the magnetooptical layer is enabled to thereby realize high resolution. Further, the interference effect can be utilized to thereby achieve an increase in sensitivity.

Further, a magnetic field sensor according to this invention is characterized in that a magnetooptical layer is directly formed at the tip of an optical fiber and a reflective layer is formed on the surface of the magnetooptical layer. A magnetic field sensor according to this invention enables a further increase in sensitivity by directly laminating, at the tip of an optical fiber, a magnetooptical layer and a lower and an upper reflective layer so as to vertically sandwich therebetween the magnetooptical layer to thereby form a Fabry-Perot resonator.

It is preferable that a diameter d of the magnetooptical layer satisfy a relationship of $dc \leqq d \leqq dr$ with a diameter dc of a core of the optical fiber and a diameter dr of a clad thereof.

Further, by setting a thickness t of the magnetooptical layer to $t \geqq 1$ μm, it is possible to increase the Q value of the Fabry-Perot resonator and thus to achieve an increase in sensitivity. The magnetooptical layer is preferably formed by a film forming method, particularly an aerosol deposition method. According to the aerosol deposition method, it is possible to form a magnetooptical film having a thickness of 1 μm or more and thus to enhance the sensitivity.

The magnetooptical layer is a ferrite having one of a garnet structure, a spinel structure, and a hexagonal structure. The magnetooptical layer may be a ferromagnetic film containing one of iron, nickel, and cobalt.

According to this invention, there is provided an electric field sensor fabrication method characterized by directly forming, at a tip of an optical fiber, an electrooptical layer that changes its refractive index depending on an electric field. A reflective layer may be formed on the surface of the electrooptical layer.

Further, according to this invention, there is provided an electric field sensor fabrication method characterized by comprising the steps of directly forming a first reflective layer at a tip of an optical fiber, directly forming, on the first reflective layer, an electrooptical layer that changes its refractive index depending on an electric field, and directly forming a second reflective layer on the electrooptical layer.

In each of the foregoing fabrication methods, there is provided a magnetic field sensor fabrication method by forming, instead of the electrooptical layer, a magnetooptical layer that changes its refractive index depending on a magnetic field.

Further, according to this invention, there are provided an electric field detection system comprising the foregoing electric field sensor and a magnetic field detection system comprising the foregoing magnetic field sensor.

BEST MODE FOR CARRYING OUT THE INVENTION

Embodiments of this invention will be described with reference to the drawings.

Figure 3:
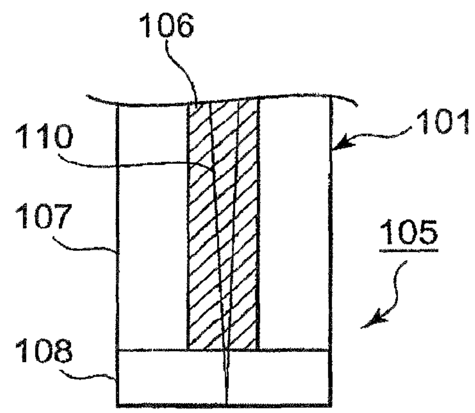
FIG. 3 is a sectional view showing the structure of an electric field sensor according to a first embodiment of this invention.
Figure 4:
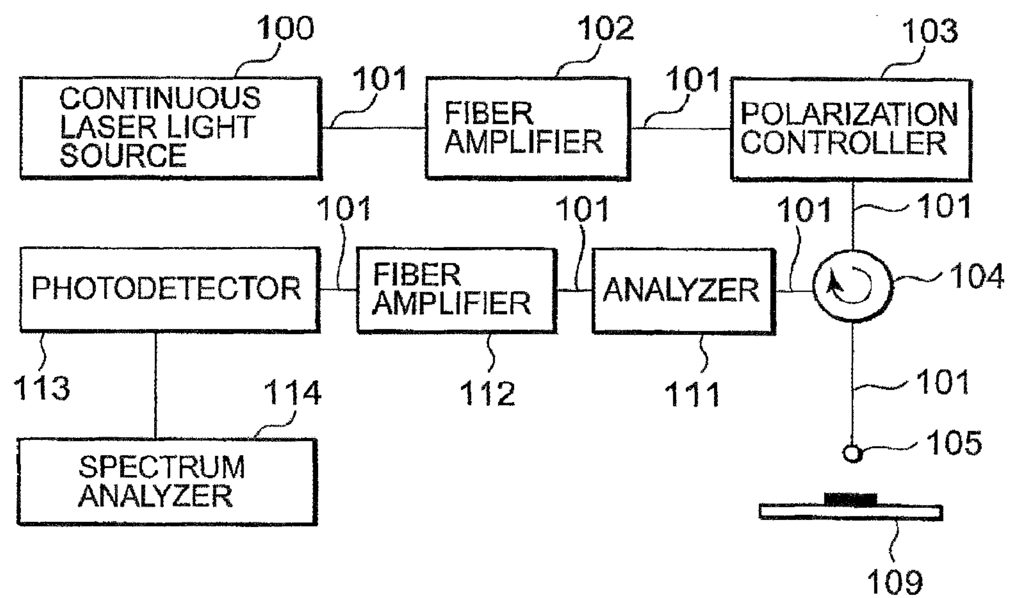
FIG. 4 is a block diagram showing the structure of an electric field detection system using the electric field sensor of FIG. 3.

FIG. 3 is a sectional view showing the structure of an electric field sensor according to the first embodiment of this invention and FIG. 4 is a block diagram showing the structure of an electric field detection system using the electric field sensor of FIG. 3.

Referring to FIG. 3, an electric field sensor 105 comprises a core layer 106 and a clad layer 107 surrounding the core layer 106, both forming an optical fiber 101, and an electrooptical layer 108 formed at the tip of the optical fiber 101. The tip of the optical fiber 101 is flattened by polishing and the electrooptical layer 108 is directly formed on the polished surface.

Referring to FIG. 4, the electric field detection system comprises a continuous laser light source 100, fiber amplifiers 102 and 112, a polarization controller 103, an optical circulator 104, the electric field sensor 105 provided over a circuit board 109 being an object to be measured, an analyzer 111, a photodetector 113, the optical fibers 101 connecting them to each other, and a spectrum analyzer 114.

Laser light emitted from the continuous laser light source 100 is amplified by the fiber amplifier 102 and subjected to control of its polarization plane by the polarization controller 103 and then is incident on the electric field sensor 105 through the optical circulator 104. Since the electrooptical layer 108 changes its refractive index depending on an electric field generated from the circuit board 109, the polarization state of reflected laser light 110 changes. The reflected laser light 110 passes through the optical circulator 104, then is converted into light indicating its polarization state by the analyzer 111 and amplified by the fiber amplifier 112, and then is converted into an electrical signal by the photodetector 113. The converted electrical signal is analyzed by the spectrum analyzer 114.

Since the resolution of the electric field sensor 105 for an amount of change in polarization state is determined by the thickness of the electrooptical layer 108, it is desirable that the electrooptical layer 108 be thin. On the other hand, the output of the electric field sensor 105 is the product of an electrooptical coefficient representing an amount of change in refractive index by an electric field and the thickness of the electrooptical layer 108. Therefore, in order to simultaneously satisfy high resolution and high output, it is important to cause the electrooptical layer 108 serving as a sensor portion to have an interference effect to thereby increase the apparent optical path length.

Figure 1:
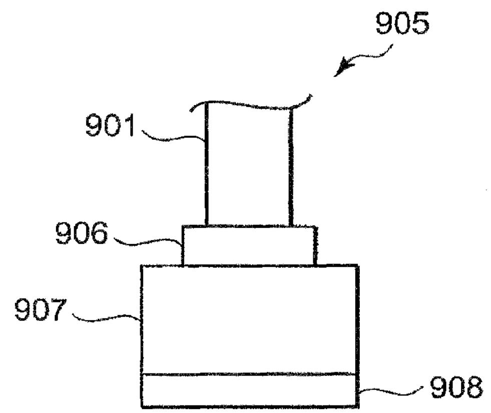
FIG. 1 is a sectional view showing the structure of a conventional electric field sensor.
Figure 2:
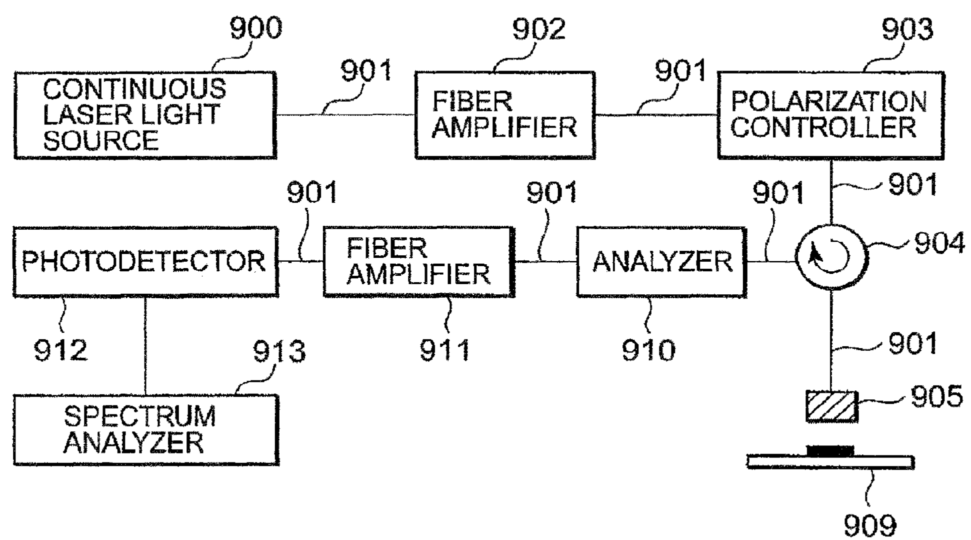
FIG. 2 is a block diagram showing the structure of an electric field detection system using the electric field sensor of FIG. 1.

The conventional example shown in FIG. 1 is configured such that the bulk electrooptical member is thin-layered and bonded to the tip of the optical fiber. However, with such a configuration, it is difficult to achieve parallelism with the end surface of the optical fiber and thus is not possible to obtain a sufficient interference effect. Further, the bulk member can be thin-layered to about 10 μm at most due to the processing limitation and thus the resolution cannot be enhanced.

In this embodiment, the electric field sensor having high sensitivity and high resolution has been realized by directly forming the electrooptical layer 108 in the form of a thin film at the tip of the optical fiber 101.

The electrooptical layer 108 was formed by an aerosol deposition method that forms a compact by pulverizing an ultrafine particle brittle material with the application of a mechanical impact force thereto and bonding them together. The film thickness was 9 microns. The film formation was carried out using $Pb(Zr_{0.6}Ti_{0.4})O_3$ (hereinafter referred to as PZT) as a material powder under the conditions that a carrier gas was oxygen, the incident angle between a nozzle and a substrate was 10 degrees, the gas flow rate was 12 liters/min, the distance between the nozzle and the substrate was 5 mm, the film forming rate was 0.8 μm/min, and the vibration frequency of a vibrator was 250 rpm.

After the film formation, the electrooptical effect of the electrooptical layer 108 was expressed by heat treatment in the atmosphere at 600° C. for about 15 minutes. Further, polarization was carried out under the application of an electric field of about 100 kV/cm at 200° C. The primary electrooptical coefficient $r_{33}$ was 200 pm/V.

Figure 5:
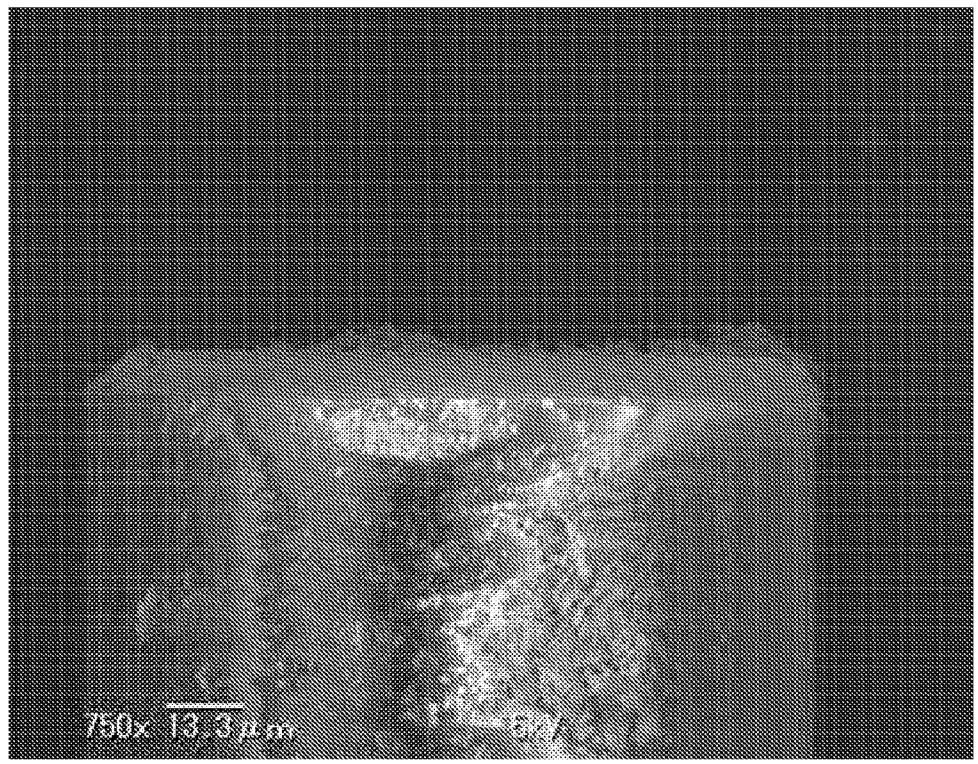
FIG. 5 is a photograph according to an SEM of an electric field sensor according to this invention.

FIG. 5 shows a photograph according to an SEM of a PZT film 202 formed at an end of an optical fiber 201 by the aerosol deposition method. It is seen that the PZT film 202 is formed to a thickness of 9 microns tightly to the end of the optical fiber 201. The aerosol deposition method has a feature of making it possible to form a thick film of a complex oxide such as PZT in a short time.

After the heat treatment, the electrooptical layer 202 (108) was polished to a thickness of 7 microns so as to be flattened in order to remove unevenness of the film surface thereof.

Figure 6:
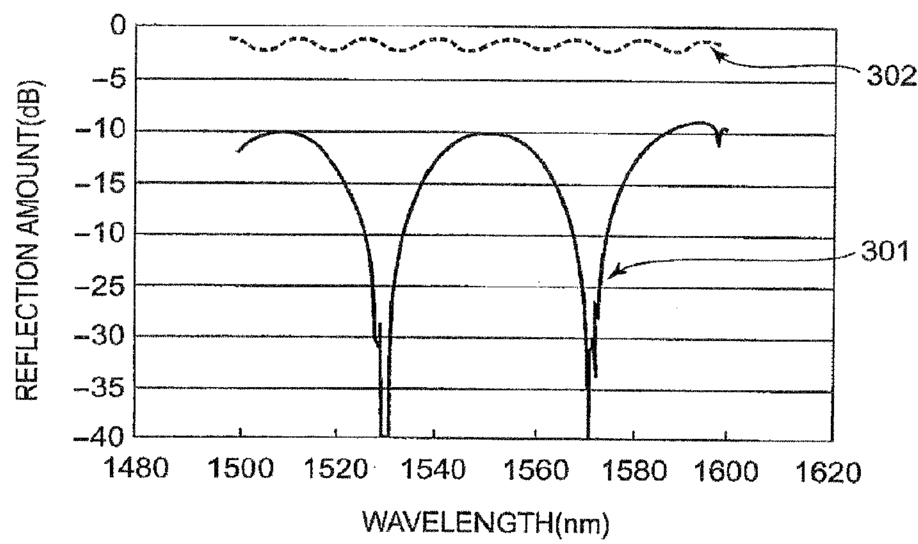
FIG. 6 is a diagram showing the reflection spectra of the electric field sensor according to this invention and the conventional electric field sensor.

FIG. 6 shows the wavelength dependence of the reflection amount after the flattening of the film surface of the electrooptical layer 202 (108). 301 denotes the reflection spectrum of this invention, wherein a modulation factor of about 30 dB is obtained. This represents that the electrooptical layer formed according to this invention achieves a large resonance structure, which is excellent as an EO sensor. For comparison, the reflection spectrum of the conventional EO sensor using the EO crystal is shown at 302. In this conventional example, the modulation factor is about 2 dB and thus it cannot be said that the sufficient resonance structure is obtained.

In the foregoing description, the composition of the electrooptical layer has been described in the case of PZT. However, the composition is not limited thereto and, for example, may be added with La.

Further, other than the lead zirconate titanate based material, barium titanate, strontium-substituted barium titanate, tantalum-substituted potassium niobate, or the like having a large electrooptical effect is also an effective material.

In this invention, the aerosol deposition method is used for forming the electrooptical layer 108, which is one of the features of this invention. The reason therefor is as follows.

One of the objects of this invention is to provide an electric field sensor having high sensitivity and high resolution. For this purpose, it is important to directly form the electrooptical layer 108 in the form of a thin film at the tip of the optical fiber 101. On the other hand, in order to obtain a high interference effect, the thickness of the electrooptical layer 108 is preferably 1 μm or more. Under the current technique, it is quite difficult for even a sputtering method or a sol-gel method to realize a 1 μm ferroelectric transparent film on a glass, a plastic, a resin containing a polymer, or a dielectric of an arbitrary composition, while, the aerosol deposition method can easily realize it.

It is important that a diameter d of the electrooptical layer 108 satisfy a relationship of $dc \leqq d \leqq dr$ with a diameter dc of the core 106 of the optical fiber 101 and a diameter dr of the clad 107 thereof. If the diameter d is no greater than dc, incident laser light is scattered and thus it is not possible to obtain a sufficient reflection light amount. Further, it is difficult for the film forming technique to form the diameter d no less than the diameter dr of the clad 107.

Figure 7:
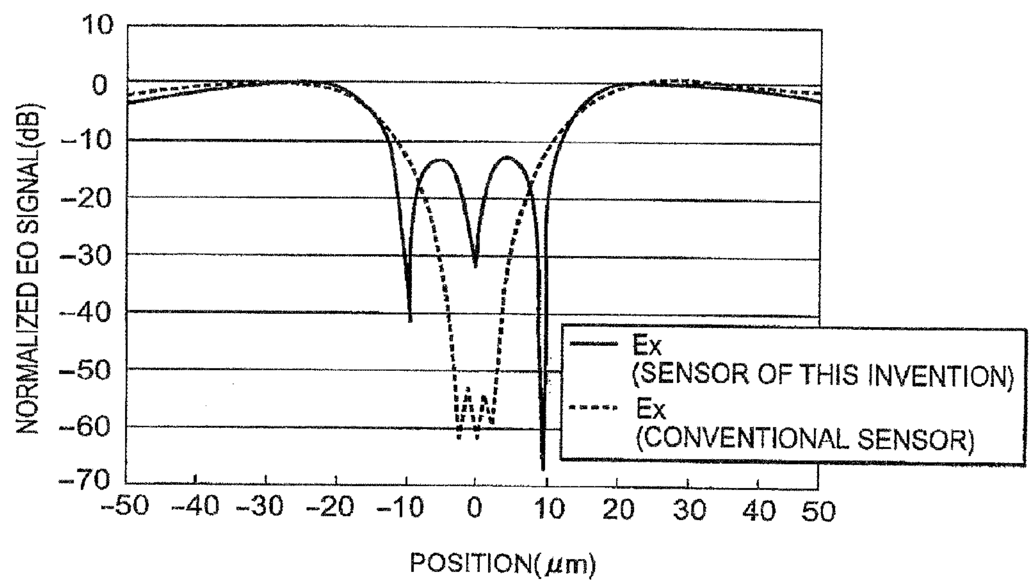
FIG. 7 is a diagram showing the electric field distribution according to the electric field sensor of this invention and the electric field distribution according to the conventional electric field sensor.

FIG. 7 shows the results of measuring the electric field distribution using the electric field sensor 105 of this embodiment and the results of measuring the electric field distribution using the conventional electric field sensor, over three-line meandering wiring with a line width/space of 5 μm. A 10 MHz, 15 dBm signal was applied to the meandering wiring. The distributions of FIG. 7 were each obtained by disposing the electric field sensor at a position of 10 μm above the wiring and scanning it at a pitch of 1 μm in a direction crossing the wiring. In the case of the conventional sensor, electric field peaks that should be observed between the adjacent lines were indistinct, while, the electric field peaks were distinctly observed with the application of the sensor of this invention. That is, FIG. 7 is one example showing that the electric field sensor of this invention has a higher spatial resolution than the conventional electric field sensor.

Figure 8:
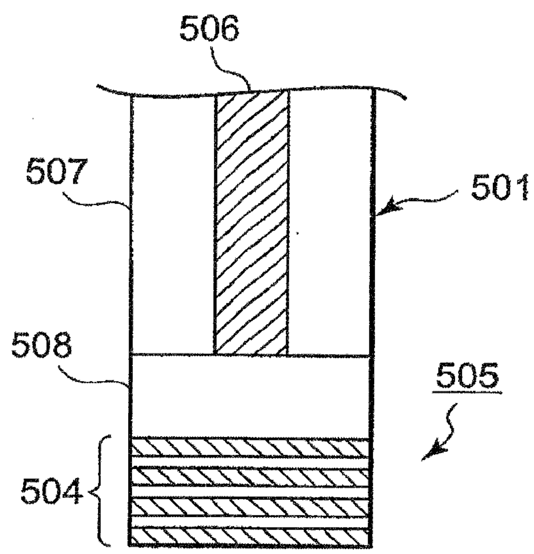
FIG. 8 is a sectional view showing a second embodiment that can further enhance the sensor sensitivity in the electric field sensor according to this invention.

FIG. 8 is a sectional view showing the structure of an electric field sensor according to the second embodiment of this invention and shows the structure that can further enhance the sensor sensitivity. In this embodiment, a dielectric multilayer reflective film 504 is added to the surface of an electrooptical layer 508 equivalent to the electrooptical layer 108 of the electric field sensor according to the first embodiment.

In FIG. 8, an electric field sensor 505 is fabricated by forming the electrooptical layer 508 at the tip of an optical fiber 501 comprising a core layer 506 and a clad layer 507 surrounding it. The tip of the optical fiber 501 is flattened by polishing and the electrooptical layer 508 is directly formed on the polished surface. The structure and fabrication method of the electrooptical layer 508 are the same as those in the first embodiment.

The dielectric multilayer reflective layer 504 was formed on the flattened electrooptical layer 508 by an ion plating method. The dielectric multilayer reflective layer 504 was formed by alternately forming $SiO_2$ films each having a thickness of 303 nm and $Ta_2O_5$ films each having a thickness of 186 nm. Film thickness control was carried out by opening/closing a shutter over a deposition source while measuring the optical spectrum using a monitor during the film formation. Using the dielectric multilayer film reflective layer 504, the interference effect can be enhanced while reducing the influence on an electric field being measured.

Figure 9:
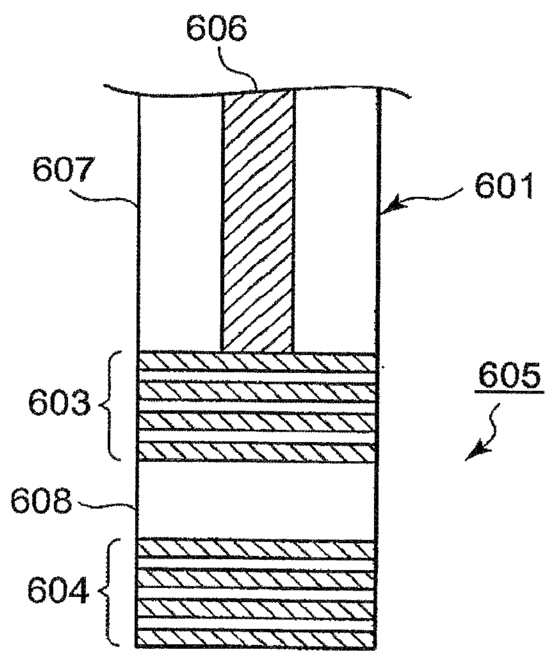
FIG. 9 is a sectional view showing a third embodiment that can enhance the sensor sensitivity more than the second embodiment of FIG. 8 in the electric field sensor according to this invention.

FIG. 9 is a sectional view showing the structure of an electric field sensor according to the third embodiment of this invention and shows the structure that can further enhance the sensor sensitivity. In this embodiment, the Fabry-Perot resonator structure is formed by directly laminating, at the tip of an optical fiber 601, a lower dielectric multilayer film reflective layer 603 and an upper dielectric multilayer film reflective layer 604 so as to vertically sandwich therebetween an electrooptical layer 608 equivalent to the electrooptical layer 108 of the electric field sensor according to the first embodiment.

In an electric field sensor 605, the lower dielectric multilayer film reflective layer 603 is formed at the tip of the optical fiber 601 comprising a core layer 606 and a clad layer 607 surrounding it. The tip of the optical fiber 601 is flattened by polishing and the lower dielectric multilayer film reflective layer 603 is directly formed on the polished surface.

The lower dielectric multilayer reflective layer 603 was formed by an ion plating method. The lower dielectric multilayer reflective layer 603 was formed by alternately forming $SiO_2$ films each having a thickness of 303 nm and $Ta_2O_5$ films each having a thickness of 186 nm. Film thickness control was carried out by opening/closing a shutter over a deposition source while measuring the optical spectrum using a monitor during the film formation. The electrooptical layer 608 and the upper dielectric multilayer film layer 604 were formed on the lower dielectric multilayer reflective layer 603. The structures and fabrication methods of the electrooptical layer 608 and the upper dielectric multilayer film layer 604 are the same as those in the second embodiment.

Figure 10:
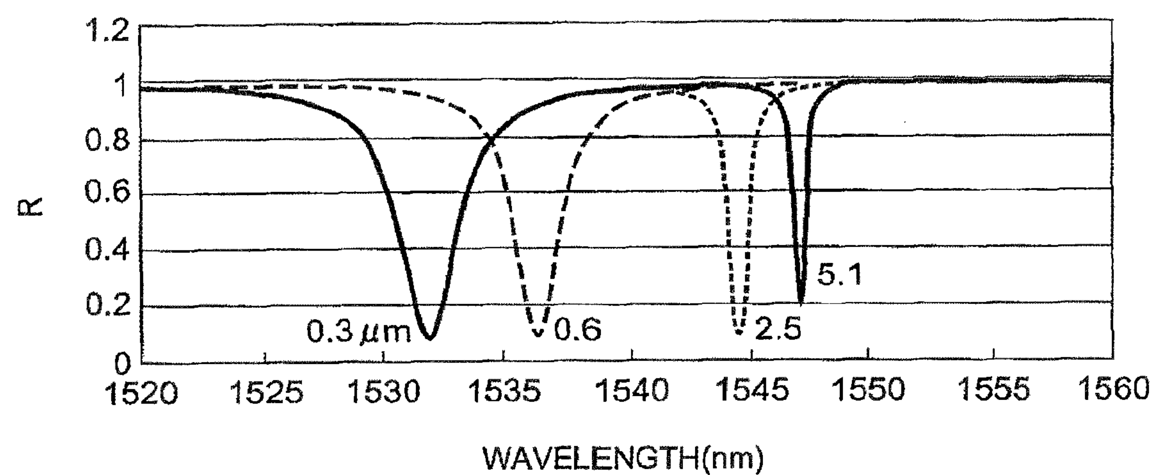
FIG. 10 is a diagram showing the PZT film thickness dependence of the reflection spectrum of the electric field sensor according to this invention.

FIG. 10 shows the electrooptical layer PZT film thickness dependence of the reflectance spectrum of the third embodiment. As the PZT film thickness increases, the half width of the resonance peak, where the reflectance is lowered, decreases. Since high-sensitivity sensing requires a Q value of 1000 or more, it is necessary that the PZT film thickness be 1 μm or more.

Figure 11:
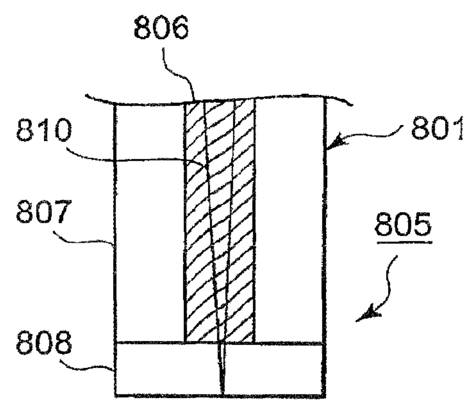
FIG. 11 is a sectional view showing the structure of a magnetic field sensor according to this invention.
Figure 12:
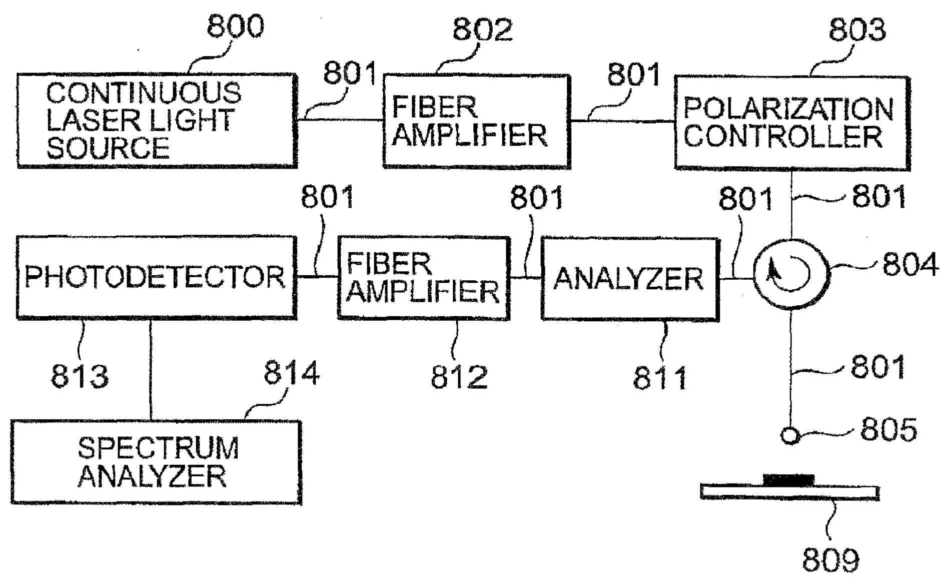
FIG. 12 is a block diagram showing the structure of a magnetic field detection system using the magnetic field sensor of FIG. 11.

FIG. 11 is a sectional view showing the structure of a magnetic field sensor according to this invention and FIG. 12 is a block diagram showing the structure of a magnetic field detection system using the magnetic field sensor of FIG. 11.

Referring to FIG. 11, a magnetic field sensor 805 comprises a core layer 806 and a clad layer 807 surrounding the core layer 806, both forming an optical fiber 801, and a magnetooptical layer 808 formed at the tip of the optical fiber 801. The tip of the optical fiber 801 is flattened by polishing and the magnetooptical layer 808 is directly formed on the polished surface.

Referring to FIG. 12, the magnetic field detection system comprises a continuous laser light source 800, fiber amplifiers 802 and 812, a polarization controller 803, an optical circulator 804, the magnetic field sensor 805 provided over a circuit board 809 being an object to be measured, an analyzer 811, a photodetector 813, the optical fibers 801 connecting them to each other, and a spectrum analyzer 814.

Laser light emitted from the continuous laser light source 800 is amplified by the fiber amplifier 802 and subjected to control of its polarization plane by the polarization controller 803 and then is incident on the magnetic field sensor 805 through the optical circulator 804.

Since the magnetooptical layer 808 changes the Faraday rotation angle depending on a magnetic field generated from the circuit board 809, the polarization state of reflected laser light 810 changes. The reflected laser light 810 passes through the optical circulator 804, then is converted into light indicating its polarization state by the analyzer 811 and amplified by the fiber amplifier 812, and then is converted into an electrical signal by the photodetector 813. The converted electrical signal can be analyzed by the spectrum analyzer 814.

Since the resolution of the magnetic field sensor 805 for an amount of change in polarization state is determined by the thickness of the magnetooptical layer 808, it is desirable that the magnetooptical layer 808 be thin. On the other hand, the output of the magnetic field sensor 805 is the product of the Faraday rotation angle and the thickness of the magnetooptical layer 808. Therefore, in order to simultaneously satisfy high resolution and high output, it is important to cause the magnetooptical layer 808 serving as a sensor portion to have an interference effect to thereby increase the apparent optical path length. The conventional example is configured such that the bulk magnetooptical member is thin-layered and bonded to the tip of the optical fiber, but it is difficult to achieve parallelism with the end surface of the optical fiber and thus is not possible to obtain a sufficient interference effect. Further, the bulk member can be thin-layered to about 10 μm at most due to the processing limitation and thus the resolution cannot be enhanced.

In this embodiment, the high-sensitivity, high-resolution magnetic field sensor has been realized by directly forming the magnetooptical layer 808 in the form of a thin film at the tip of the optical fiber 801.

The magnetooptical layer 808 was formed by an aerosol deposition method that forms a compact by pulverizing an ultrafine particle brittle material with the application of a mechanical impact force thereto and bonding them together. The film thickness was 4000 nm. The film formation was carried out using Bi-substituted YIG garnet as a material powder under the conditions that a carrier gas was oxygen, the incident angle between a nozzle and a substrate was 30 degrees, the gas flow rate was 8 liters/min, the distance between the nozzle and the substrate was 5 mm, the film forming rate was 1.0 μm/min, and the vibration frequency of a vibrator was 250 rpm.

After the film formation, the magnetooptical effect of the magnetooptical layer 808 was expressed by heat treatment in the atmosphere at 600° C. for about 15 minutes. The Faraday rotation angle was 7 deg/μm. After the heat treatment, the magnetooptical layer 808 was polished to a thickness of 3600 nm so as to be flattened in order to remove unevenness of the film surface thereof.

In the foregoing description, the magnetooptical layer has been described in the case of Bi-substituted YIG garnet. However, the composition is not limited thereto and, for example, may be added with Ce.

Further, other than the YIG garnet based material, a ferrite or the like having either of a spinel structure and a hexagonal structure with a large magnetooptical effect is also an effective material.

In this invention, the aerosol deposition method is used for forming the magnetooptical layer, which is one of the features of this invention. The reason therefor is as follows.

One of the objects of this invention is to provide a magnetic field sensor having high sensitivity and high resolution. For this purpose, it is important to directly form a magnetooptical layer in the form of a thin film at the tip of an optical fiber. On the other hand, in order to obtain a high interference effect, the thickness thereof is preferably 1 μm or more. Under the current technique, it is impossible for even a sputtering method or a sol-gel method to realize a 1 μm ferromagnetic transparent film on a glass, a plastic, a resin containing a polymer, or a dielectric of an arbitrary composition, while, only the aerosol deposition method makes it possible.

It is important that a diameter d of the magnetooptical layer 808 satisfy a relationship of $dc \leqq d \leqq dr$ with a diameter dc of the core of the optical fiber 801 and a diameter dr of the clad thereof. If the diameter d of the magnetooptical layer 808 is no greater than the diameter dc of the core, incident laser light is scattered and thus it is not possible to obtain a sufficient reflection light amount. Further, it is difficult for the film forming technique to form the magnetooptical layer 808 to have a diameter no less than the diameter dr of the clad.

Further, as the magnetooptical layer 808, it is possible to use a ferromagnetic film in the form of a very thin layer containing one of iron, nickel, and cobalt.

A magnetic field sensor according to this invention is not limited to the example of FIG. 11, i.e. the same effect is achieved by replacing the electrooptical film of each of the electric field sensors according to the first to third embodiments with a magnetooptical film. That is, a multilayer reflective layer may be formed on the surface of the magnetooptical layer 808 in the magnetic field sensor 805 of FIG. 11.

Further, a magnetic field sensor according to this invention may have a structure in which a first multilayer reflective layer and a second multilayer reflective layer are laminated so as to vertically sandwich therebetween the magnetooptical layer 808 in the magnetic field sensor 805 of FIG. 11.

As is clear from the foregoing description, according to this invention, there are provided electric field/magnetic field sensors each having high sensitivity and high resolution.

The invention claimed is:

1. A magnetic field sensor fabrication method, comprising the steps of:

using an aerosol deposition on a distal end face of a tip of an optical fiber, directly forming a magnetooptical layer having a refractive index that changes depending on a magnetic field, wherein a first end face of the magnetooptical layer contacts the distal end face of the tip of the optical fiber, wherein the magnetooptical layer extends over the distal end face of the tip of the optical fiber, and wherein a diameter d of said magnetooptical layer, a diameter dc of a core of said optical fiber, and a diameter dr of a clad thereof satisfies a relationship of $dc \leqq d \leqq dr$.

2. The magnetic field sensor fabrication method according to claim 1, further comprising forming a reflective layer on a second end surface of said magnetooptical layer.

3. The magnetic field sensor fabrication method according to claim 1, wherein a thickness t of said magnetooptical layer is $t \geqq 1$ μm.

4. The magnetic field sensor fabrication method according to claim 1, wherein said magnetooptical layer is a ferrite having one of a garnet structure, a spinel structure, and a hexagonal structure.

5. The magnetic field sensor fabrication method according claim 1, wherein said magnetooptical layer is a ferromagnetic film containing one of iron, nickel, and cobalt.

6. A magnetic field sensor fabrication method, comprising the steps of:

directly forming a first reflective layer on a distal end face of a tip of an optical fiber so that a first end face of the first reflective layer contacts the distal end face of the tip of the optical fiber;

directly forming, with an aerosol deposition method, on a second end face of said first reflective layer, a magnetooptical layer with a refractive index that changes depending on a magnetic field so that a first end face of the magnetooptical layer contacts the second end face of the first reflective layer; and directly forming a second reflective layer on said magnetooptical layer so that a second end face of the magnetooptical layer contacts a first end face of the second reflective layer, wherein a relationship of $dc \leqq d \leqq dr$ is established among a diameter d of said magnetooptical layer, a diameter dc of a core of said optical fiber, and a diameter dr of a clad thereof.

7. The magnetic field sensor fabrication method according to claim 6, wherein a thickness t of said magnetooptical layer is $t \geqq 1$ μm.

8. The magnetic field sensor fabrication method according to claim 6, wherein said magnetooptical layer is a ferrite having one of a garnet structure, a spinel structure, and a hexagonal structure.

9. The magnetic field sensor fabrication method according to claim 6, wherein said magnetooptical layer is a ferromagnetic film containing one of iron, nickel, and cobalt.

* * * * *